United States Patent [19]

Whatmore et al.

[11] Patent Number: 5,076,901

[45] Date of Patent: Dec. 31, 1991

[54] METHOD OF MANUFACTURING PEROVSKITE LEAD SCANDIUM TANTALATE

[75] Inventors: Roger W. Whatmore, Bletchley; Martin T. Goosey, Northampton; Laurence Considine, Towcester; Anil Patel, Leicester, all of United Kingdom

[73] Assignee: GEC-Marconi Limited, Stanmore, England

[21] Appl. No.: 438,454

[22] PCT Filed: Apr. 17, 1989

[86] PCT No.: PCT/GB89/00395

§ 371 Date: Jan. 18, 1990

§ 102(e) Date: Jan. 18, 1990

[87] PCT Pub. No.: WO89/10335

PCT Pub. Date: Nov. 2, 1989

[30] Foreign Application Priority Data

Apr. 27, 1988 [GB] United Kingdom ............... 8809955

[51] Int. Cl.[5] ..................... C23C 14/34; C01F 17/00
[52] U.S. Cl. ...................... 204/192.15; 204/192.18; 204/192.22; 423/593; 501/134
[58] Field of Search ............... 501/134; 423/593; 204/192.15, 192.18, 192.22

[56] References Cited

U.S. PATENT DOCUMENTS 4,853,199  8/1989  Inoue et al. .................... 423/593

Primary Examiner—Wayne A. Langel
Attorney, Agent, or Firm—Fleit, Jacobson, Cohn, Price, Holman & Stern

[57] ABSTRACT

A method is described of manufacturing perovskite lead scandium tantalate comprising the pre-reaction of scandium and tantalum oxides at temperatures between 1000° C. and 1400° C. to form scandium tantalate. The scandium tantalate is then reacted with lead oxide to form the desired perovskite phase lead scandium tantalate. In one embodiment there is described a method for the deposition of perovskite lead scandium tantalate films from metal organic precusors. The availability of metal organic precursors allows the deposition of thin films directly from solution or by MOCVD techniques. One particular material, lead scandium tantalate $Pb(Sc_{0.5}Ta_{0.5})O_3$, is described. The principal features of the invention are the deposition of scandium and tantalum components from solution or by MOCVD onto the required substrate. These are then prereacted to yield scandium tantalate. A lead containing film or vapor is then reacted with the scandium tantalate to form the perovskite phase lead scandium tantalate.

27 Claims, 4 Drawing Sheets

| PRECURSOR | LEAD BUTOXIDE | | SCANDIUM FOD | TANTALUM ETHOXIDE |
|---|---|---|---|---|
| PRECURSOR TEMP | 185 C | | 95 C | 146 C | 124 C |
| DEPOSITION RATE | 1 μm/hr | | 0-75 μm/hr | 10 μm | 5 μm/hr |
| DEPOSIT PHASE | Pb | PbO | $Sc_2O_3$ | $Ta_2O_5$ |
| CARRIER GAS | Ar | | Ar/10%$O_2$ | | |
| FLOW RATE | | | 15 sc cm | | |
| PRESSURE | | | 500 m Torr | | |
| MEASURED SURFACE TEMP | 400 C | | 450 C | | |

| PRECURSOR | LEAD BUTOXIDE | | SCANDIUM FOD | TANTALUM ETHOXIDE | |
|---|---|---|---|---|---|
| PRECURSOR TEMP | 185 C | | 95 C | 146 C | 124 C |
| DEPOSITION RATE | 1 μm/hr | | 0-75 μm/hr | ·10μm | 5μm/hr |
| DEPOSIT PHASE | Pb | PbO | $Sc_2O_3$ | $Ta_2O_5$ | |
| CARRIER GAS | Ar | | Ar/10%$O_2$ | | |
| FLOW RATE | 15sc cm | | | | |
| PRESSURE | 500 m Torr | | | | |
| MEASURED SURFACE TEMP | 400 C | | 450 C | | |

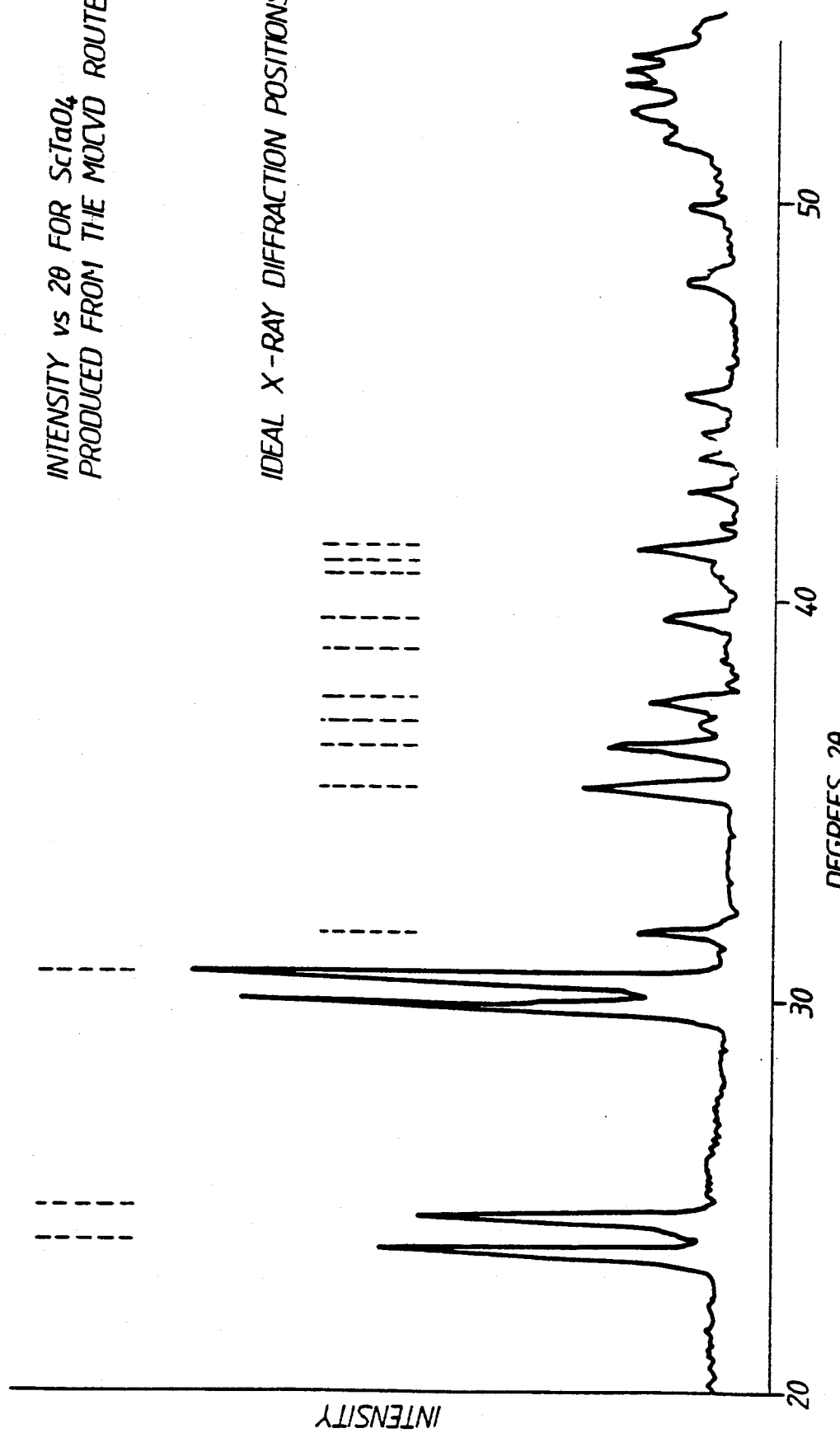

METHOD OF MANUFACTURING PEROVSKITE LEAD SCANDIUM TANTALATE

The present invention relates to a method of manufacturing perovskite lead scandium tantalate (PST) and more particularly, but not exclusively, to a method of manufacturing PST thin films.

The fabrication of ceramic derived thermal detectors often requires the production of very thin slices of material. This is traditionally achieved by difficult and time consuming lappina dn polishing techniques. In order to develop alternate routes to thin film ceramic, methods exploiting the recently developed emtal organic precursors of these ceramics have been extensively utilised. These techniques include the deposition of thin films from metal organic solutions and by metal organic chemical vapour deposition (MOCVD). Both these methods allow the controlled deposition of ceramic films with thicknesses less than 0.1 $\mu$m and upwards.

These techniques have been successfully developed for material such as lead titanate but extension to lead scandium tantalate (PST) has been prevented by the inability to deposit the PST films with the desired 100% perovskite rystal structure. By depositing the lead, scandium and tantalum from a single metal organic solution only small amounts of the perovskite phase were obtained after firing.

An objective of the present invention is to provide an improved method of manufacturing perovskite lead scandium tantalate.

According to the present invention there is provided a method of manufacturing perovskite lead scandium tantalate comprising heating scandium oxide and tantalum oxide to form scandium tantalate and heating the scandium tantalate in the presence of lead.

In one embodiment a film of perovskite lead scandium tantalate is formed by first depositing layers of scandium oxide and tantalum oxide or a mixed oxide layer of scandium oxide and tantalum oxide, heating the layers or the mixed layer to form a layer of scandium tantalate and heating the scandium tantalate layer in the presence of lead.

Preferably the scandium tantalate is heated in the presence of lead oxide.

In one embodiment, perovskite $PbSc_{\frac{1}{2}}Ta_{\frac{1}{2}}O_3$ (PST) films are manufactured by first depositing layers of $Sc_2O_3$. $Ta_2O_5$ or a mixed oxide layer of $Sc_2O_3$ and $Ta_2O_5$, heating to form $ScTaO_4$ and then heating the $ScTaO_4$ layer in the presence of lead. In one embodiment the layers of scandium and tantalum oxides or the mixed oxide layer of scandium and tantalum oxides are heated to temperatures above 1000° C., and preferably to temperaturse between 1000° C. and 1400° C.

A mixed layer of $Sc_2O_3$ and $Ta_2O_5$ may be deposited from solution, starting with scandium (III) acetylacetonate (Scacac)$_3$ and tantalum ethoxide Ta(OEt)$_5$ as precursors in methoxyethanol solution, consisting of taking the Sc(acac)$_3$ into solution at for example 120° C. cooling to 90° C. adding Ta(OEt)$_5$, complexing at 120° C., cooling and spinning the resulting solution onto the selected substrate and drying the film at 150° C. Thick layers of mxied scandium and tantalum oxides are formed by repeating the process.

Alternatively mixed layers of scandium and tantalum oxides are formed by using metal organic chemical vapour deposition (MOCVD), consisting of passing volatile metal organic compounds of scandium and tantalum over a heated substrate at reduced pressure where they decompose to give the oxides. The metal organic compounds are advantageously scandium (FOD)$_3$ as described later and tantalum ethoxide respectively.

Typically the perovskite PST layers may be formed by reacting $ScTaO_4$ layers in the presence of lead oxide at temperature for example of between 850° C. and 1300° C. The lead oxide may in one embodiment be in the form of a vapour produced by lead zirconate or a mixture of lead zirconate and lead oxide.

Alternatively the lead oxide is first deposited as a layer onto the surface of the $ScTaO_4$ layer; for example by spinning onto the $ScTaO_4$ a dehydrated solution of lead acetate in methoxyethanol, followed by a drying stage and firing.

In a further embodiment the lead oxide is deposited from a vapour of a metal organic precursor such as lead tertiary butoxide and the atmosphere is a low pressure mixture of argon and oxygen. Alternatively the metal organic precursor is lead (FOD)$_2$.

In other embodiments the lead oxide is deposited by evaporation or is deposited by sputtering or is deposited by settling of particles from a suspension of PbO in a fluid, or is deposited by dipping, or is deposited by spraying.

Details of the deposition methods referred to above are well known in the art and will therefore not be described herein.

The present invention will be described further, by way of examples, with reference to the accompanying drawings in which:

FIG. 2 illustrates a double crucible arrangement utilised for annealing a sample in accordance with an embodiment of the present invention;

FIG. 4 is an x-ray diffraction curve for $ScTaO_4$ employing a MOCVD method of preparation and FIG. 5 is a table of the deposition conditions for PST.

The first method to be described hereinafter is the deposition of the oxide layers from solution.

After taking into account such factors as reactivity, solubility, organic content, decomposition temperature, cost and availability, lead (II) acetate Pb(OAc)$_2$.3H$_2$O, Sc(III) acetyl acetonate Sc(acac)$_3$ and tantalum (V) ethoxide Ta(OEt)$_5$ have been identified as suitable precursors for the solution route. The deposition for PST involves a two-step process (i) the deposition and preraction of Sc and Ta to give $ScTaO_4$ and (ii) the reaction of $ScTaO_4$ with lead to form PST.

The precursor solution for depositing $ScTaO_4$ is prepared by reacting Sc(acac)$_3$ and Ta(OEt)$_5$ in methoxyethanol solution as shown in the scheme below:

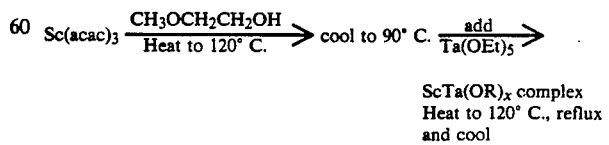

$$Sc(acac)_3 \xrightarrow[\text{Heat to 120° C.}]{CH_3OCH_2CH_2OH} \text{cool to 90° C.} \xrightarrow{\text{add}}_{Ta(OEt)_5}$$

ScTa(OR)$_x$ complex
Heat to 120° C., reflux
and cool

Figure 1:
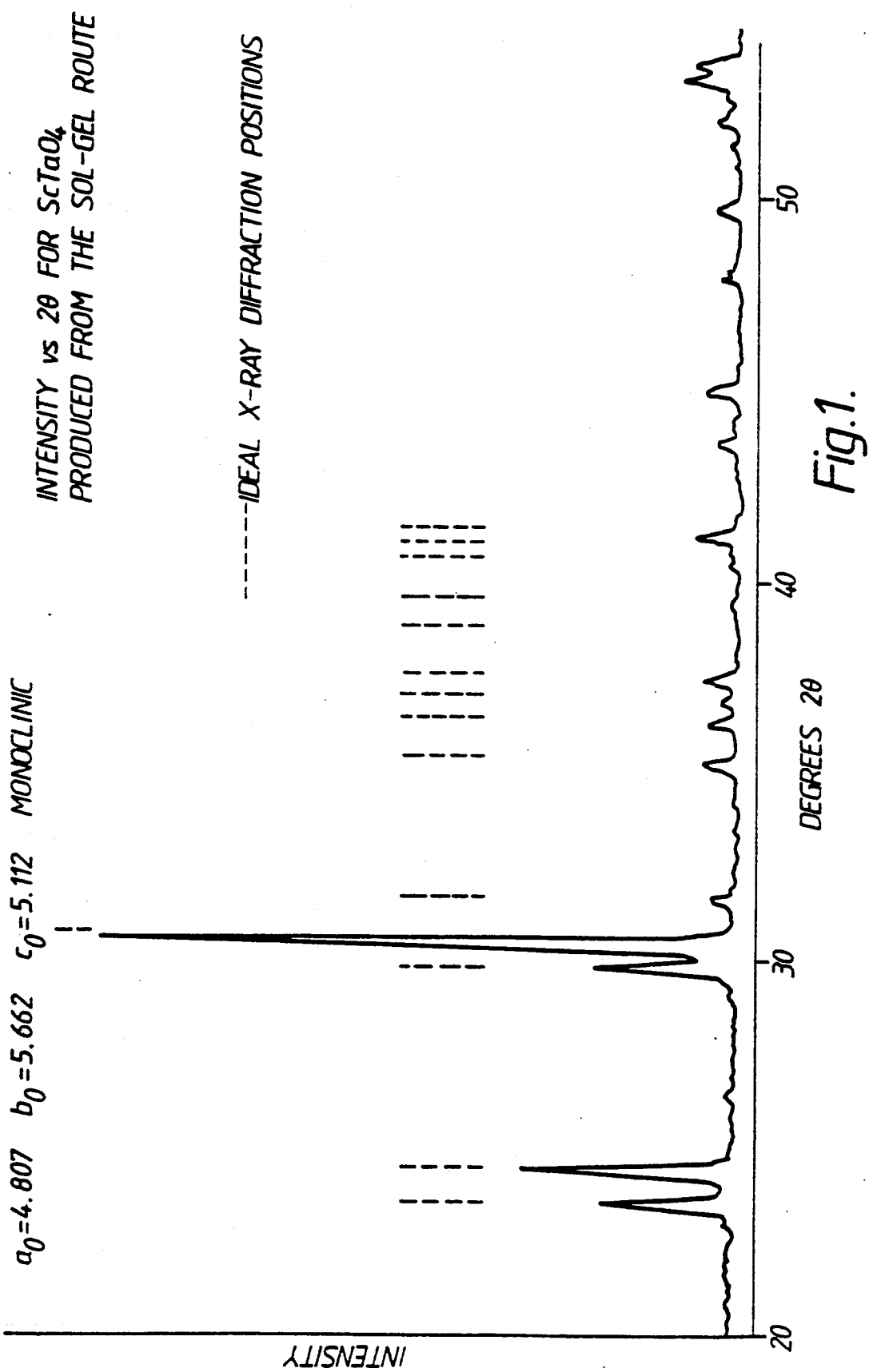
FIG. 1 is an x-ray diffraction curve for $ScTaO_4$ employing a SOL-GEL method of preparation according to an embodiment of the present invention.

A thin film of the above is fabricated by spin coating at 2000 rpm on a standard photoresist spinner using a polished and thoroughly cleaned substrate such as single crystal sapphire. A film of about 0.6 μm is built up by successive depositions with intermediate drying at 150° C/10 mins. X-ray diffraction analysis of such a film after annealing at 1400° C./2 hrs. should show it to be 100% ScTaO$_4$, as shown by the X-ray diffraction curve given in FIG. 1. These conditions are not exclusive and other etmperature time annealing combinations are also successful. Reaction with lead is subsequently accomplished by successively depositing lead containing layers onto the ScTaO$_4$ using a solution of dehydrated Pb(OAc)$_2$ in methoxyethanol by spinning, dipping or spraying. The resultant film is then annealed at 900° C./3 hrs. in a double crucible arrangement (FIG. 2) with lead zirconate (PZ) spacer pwder. x-ray diffraction analysis has shown the film to be a single phase sharp perovskite like that as shown in FIG. 3. Alternatively, i has also been shown that PST can be produced by thermally annealing ScTaO$_4$ in a high partial pressure of lead oxide thereby obviating the second lead deposition. A high partial pressure of lead oxide can be produced by annealing the layers in an apparatus such as in FIG. 2 where the powder is PbZrO$_3$ or a mixture of PbZrO$_3$ and PbO. Placing more PbO in this powder will increase the partial pressure of the lead oxide in the atmosphere over the layer. This process involving a prereaction stage is novel for the deposition of thin films and bulk ceramic PST.

Alternative metal organic precursors which can be used in the solution deposition route are:

(i) Sc(OR)$_3$ where R is an alkyl gruop such as
R=Me, CH$_2$CH$_3$, CH(CH$_3$)$_2$, C(CH$_3$)$_3$
Sc(DPM)$_3$, DPM=2,3,6,6-Tetramethyl-3,5-heptanedione
Sc(FOD)$_3$. FOD=Fluorinated octanedione
The composition of Sc(FOD)$_3$ is scandium 1,1,1,2,2,3,3-heptafluoro-7,7-dimethyl-4,6-octanedione.

(ii) Ta(OR)$_5$ where R is an alkyl group such as
R=CH$_3$, CH$_2$CH$_3$, CH(CH$_3$)$_2$, Me(CH$_2$)$_2$, Me(CH$_2$)$_3$, C(CH$_3$)$_3$ (iii) Pb(OR)$_2$ where R is an alkyl group such as
R=CH$_3$, CH$_2$CH$_3$.Me(CH$_2$)$_3$, CH(CH$_3$)$_2$ This thin film deposition process is not restricted to the sol-gel method as it has also been shown that ScTaO$_4$ can be deposited using MOCVD (metallogranic chemical vapor deposition) and volatile scandium and tantalum precursors. The resultang films can be reacted with lead in a lead rich environment at 1200° C. to give perovskite PST.

The metal oxides of scandium and tantalum can be deposited onto a heated substrate in an apparatus as described above. The volatile scandium and tantalum precursors are placed in two of the stainless steel bubblers and a carrier gas (which can be argon or a mixture of argon and oxygen) is passed through each bubbler at a known rate. Each bubbler is heated to a a temperature determined to give a known vapour pressure of each precursor. (Provision is also made for the inclusion of bubblers containing other metal organic precursors which may be required, such as lead, titanium or niobium). Volatile precursors which have been selected as being particularly suitable for the growth of the scandium and tantalum oxides being Sc(FOD)$_3$ having a composition scandium 1,1,1,2,2,3,3-Heptafluoro-7,7-dimethyl-4,6-oxtanedione.

For scandium

Sc(OR$_1$)$_3$ where R$_1$ is an alkyl or substituted alkyl or

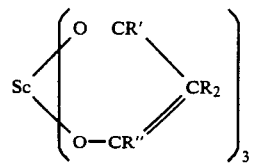

where R' and R" may be individually selected from alkyl, aryl, alkoxy or fluorinated alkyl. Preferably R' is tertiary butyl and R" heptafluoro-propyl. R$_2$ is preferably hydrogen but may alternatively be halogen or low alkyl.

For tantalum

Ta(OR)$_{5-n}$(Y)$_n$ n=0-3 where R is alkyl or substituted alkyl and Y is a substituted pentanedione. Preferably R is ethyl and n=0.

Figures 2, 5:
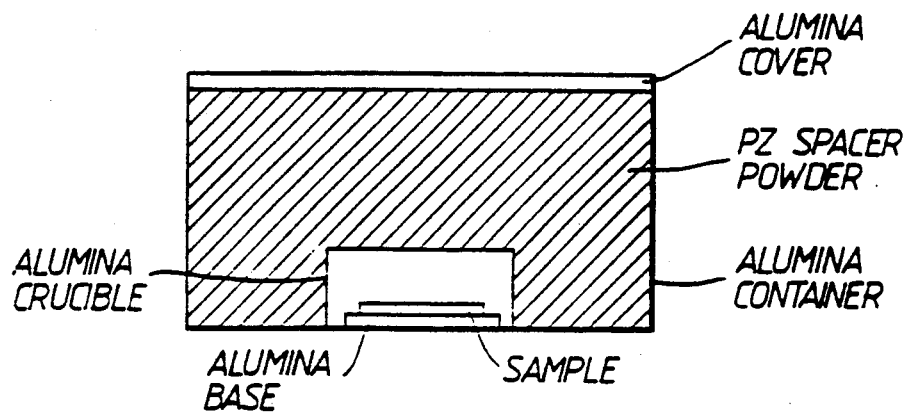
Figure 3:
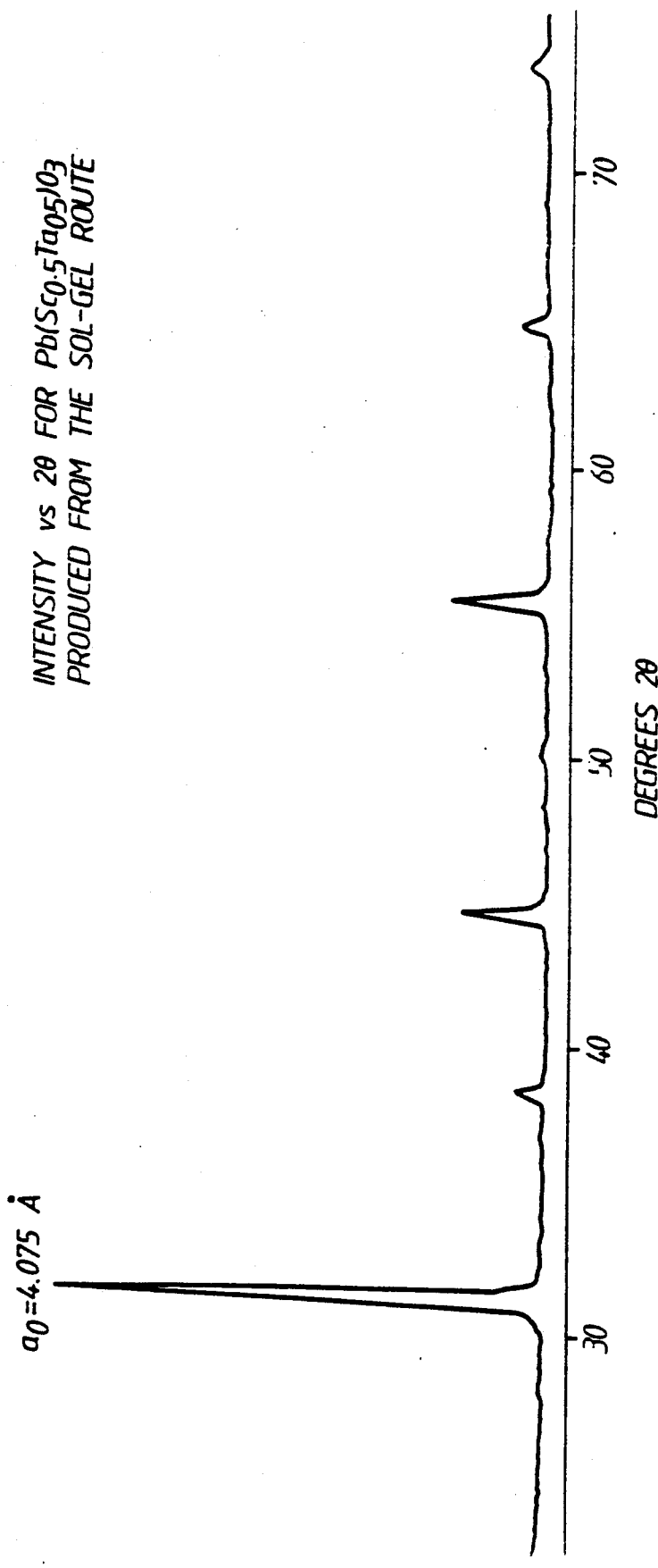
FIG. 3 is an x-ray diffraction curve of the annealed sample of FIG. 2.

The conditions which are suitable for depositing the scandium and tantalum oxides are shown in FIG. 5. It can be seen that the tantalum oxide can be grown much more rapidly than scandium oxide. A mixed scandium/tantalum oxide layer can be grown under similar conditions to those stipulated in FIG. 5.

If this is fired at 1000° C. for 16 hours then a ScTaO$_4$ phase is formed as shown in the X-ray diffraction trace in FIG. 5. Higher temperature firing, up to 1400° C. is permissible. This firing could be carried out in the MOCVD reactor. The ScTaO$_4$ layer formed by the MOCVD route can be reacted to form perovskite PST in one of the following ways:

(a) annealing in a PbO-rich atmosphere (b) depositing a lead acetate layer onto the surface as described above and annealing the layer in the apparatus described in FIG. 2.

(c) growing a PbO layer onto the surface of the ScTaO$_4$ using the MOCVD technique and annealing the composite layer in the apparatus described in FIG. 2. The PbO layer can be grown in the same apparatus shown in FIG. 4 as is used for the ScTaO$_4$ growth. Lead tertiary butoxide has been identified as a suitable volatile precursor for the PbO growth.

Alternative volatile lead oxide precursors which could be used are Pb(R)$_2$ where R is alkyl or alkoxy (OR$_1$), where R$_1$ is preferably tertiary butoxide but may be alkyl or substituted alkyl or R may be a substituted diketonate.

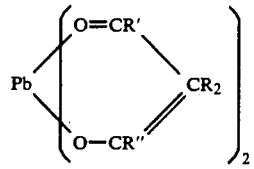

Where R' and R" may be individually selected from alkyl-, aryl, alkoxy or fluorinated alkyl. R$_2$ is preferably hydrogen but may alternatively be halogen or low alkyl.

The conditions for the growth of lead oxide from lead t-butoxide are given in FIG. 5. It can be seen that lead oxide is deposited in a mixed argon/oxygen atmosphere at low pressure. If the atmosphere is pure argon then metallic lead is deposited. This is a feasible variation on the process, as metallic lead can be oxidized during the final annaling by conducting said annealing in an oxygen containing atmosphere.

In feasible modifications to the processes described above, the lead oxide layer could be deposited by MOCVD onto a ScTaO₄ layer grown via the solution route. Alternatively, the lead containing layer can be deposited onto a ScTaO₄ layer formed via either solution or MOCVD routes by any one of the following methods:

(a) evaporation of PbO
(b) evaporation of Pb followed by thermal oxidation during the final anneal
(c) sputtering of PbO
(d) sputtering of Pb followed by thermal oxidation during the final anneal
(e) allowing a suspension of PbO particles formed by grinding PbO in a fluid to settle onto the ScTaO₄ surface.

Whereas the above described describes various embodiments of the present invention it will be appreciated that other embodiments exist which fall within the scope of the present invention. For example various photolytic processes may be employed wherein ultra-violet light is used to irradiate precursors in order to promote their decomposition. In another example plasma enhancement may be employed.

We claim:

1. A method of manufacturing perovskite lead scandium tantalate comprising the steps of:
   (a) heating scandium oxide and tantalum oxide to form scandium tantalate; and
   (b) heating the scandium tantalate in the presence of lead to form the perovskite lead scandium tantalate.

2. A method of manufacturing perovskite lead scandium tantalate as claimed in claim 1 wherein a film of perovskite lead scandium tantalate is formed by first depositing layers of scandium oxide and tantalum oxide or a mixed oxide layer of scandium oxide and tantalum oxide, heating the layers or the mixed layer to form a layer of scandium tantalate and heating the scandium tantalate layer in the presence of lead.

3. A method of manufacturing perovskite lead scandium tantalate comprising the steps of:
   (a) heating scandium oxide and tantalum oxide tof orm scandium tantalate; and
   (b) heating the scandium tantalate in the presence of lead oxide to form the perovskite lead scandium tantalate.

4. A method of manufacturing perovskite lead scandium tantalate as claimed in claim 3, wherein a film of perovskite lead scandium tantalate is formed by first depositing layers of scandium oxide and tantalum oxide or a mixed oxide layer of scandium oxide and tantalum oxide, heating the layers or the mixed layer to form a layer of scandium tantalate and heating the scandium tantalate in the presence of lead oxide.

5. A method of manufacturing perovskite lead scandium tantalate films as claimed in claim 4 wherein the mixed oxide layer of scandium oxide and tantalum oxide is deposited from solution.

6. A method of manufacturing perovskite lead scandium tantalate as claimed in claim 5 wherein the solution comprises starting with scandium (III) acetylacetonate Sc(acac)₃ and tantalum ethoxide Ta(OEt)₅ as precursors in methoxyethanol solution, the method comprising taking the Sc(acac)₃ into solution adding Ta(OEt)₅, complexing, cooling and spinning the resulting solution onto a selected substrate and drying the resulting film.

7. A method of manufacturing perovskite lead scandium tantalate films as claimed in claim 6 wherein a plurality of layers of scandium oxide and tantalum oxide or a plurality of mixed oxide layers are formed by repeating the method of deposition a plurality of times.

8. A method of manufacturing perovskite lead scandium tantalate as claimed in calim 4 wherein layers of scandium oxide and tantalum oxides or mixed layers of scandium and tantalum oxides are formed by using chemical vapour deposition, comprising passing compounds of scandium and tantalum over a substrate where they decompose to produce the oxides.

9. A method of manufacturing perovskite lead scandium tantalate as claimed in claim 8 wherein the layers of scandium oxide and tantalum oxides or mixed layers of scandium and tantalum oxides are formed by using metal organic chemical vapour deposition, comprising passing the metal organic compounds of scandium and tantalum over a heated substrate where they decompose to produce the oxides.

10. A method of manufacturing perovskite lead scandium tantalate as claimed in claim 9 wherein the tantalum oxide is deposited from a vapor of metal organic precursor.

11. A method of manufacturing perovskite lead scandium tantalate as claimed in claim 10 wherein the tantalum oxide precursor is a tantalum alkoxide.

12. A method of manufacturing perovskite lead scandium tantalate as claimed in claim 10 wherein the tantalum oxide precursor is a tantalum ethoxide.

13. A method of manufacturing perovskite lead scandium tantalate films as claimed in claim 12 wherien the films are formed by reacting scandium tantalte in the presence of lead oxide at temperatures between 850° C. and 1300° C.

14. A method of manufacturing perovskite lead scandium tantalate as claimed in claim 13 wherein the lead oxide is in the form of a vapour produced by lead zirconate or a mixture of lead zirconate and lead oxide.

15. A method of manufacturing perovskite lead scandium tantalate as claimed in claim 13 wherein the lead oxide is first deposited as a layer onto the surface of the scandium tantalate layer.

16. A method of manufacturing perovskite lead scandium tantalate as claimed in claim 15 wherein the lead oxide is deposited by spinning onto the scandium tantalate a solution of lead acetate in methoxyethanol, followed by a drying stage and hating.

17. A method of manufacturing perovskite lead scandium tantalate as claimed in claim 15 wherein the lead oxide is deposited from a vapour of a metal organic precursor.

18. A method of manufacturing perovskite lead scandium tantalate as claimed in claim 17 wherein the metal organic precursor is lead tertiary butoxide and the atmosphere is a mixture of argon and oxygen.

19. A method of manufacturing perovskite lead scandium tantalate as claimed in claim 15 wherein the lead oxide is deposited by evaporation.

20. A method of manufacturing perovskite lead scandium tantalate as claimed in claim 15 wherein the lead oxide is deposited by sputtering.

21. A method of manufacturing perovskite lead scandium tantalate as claimed in claim 15 wherein the lead oxide is deposited by settling of particles from a suspension of lead oxide in a fluid.

22. A method of manufacturing perovskite lead scandium tantalate as claimed in claim 16 wherein the lead oxide is deposited by dipping.

23. A method of manufacturing perovskite lead scandium tantalate as claimed in claim 16 wherein the lead oxide is deposited by spraying.

24. A method of manufacturing perovskite lead scandium tantalate as claimed in claim 1 wherein lead is evaporated onto the scandium tantalate and thermal oxidation of the lead occurs during subsequent heating.

25. A method of manufacturing perovskite lead scandium tantalate as claimed in claim 1 wherein lead is sputtered onto the scandium tantalate and thermal oxidation of the lead occurs during subsequent heating.

26. A method of manufacturing perovskite lead scandium tantalate as claimed in claim 25 wherein the scandium and tantalum oxides are heated to between 1000° C. and 1400° C. to form the scandium tantalate.

27. The process of claim 3, wherein the scandium and tantalum oxides are heated between 1000° C. and 1400° c. to form the scandium tantalate.

* * * * *